United States Patent
Kelly

(10) Patent No.: US 9,207,263 B2
(45) Date of Patent: Dec. 8, 2015

(54) DYNAMIC OSCILLOSCOPE TRIGGERING

(75) Inventor: David L. Kelly, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 1054 days.

(21) Appl. No.: 12/961,443

(22) Filed: Dec. 6, 2010

(65) Prior Publication Data

US 2011/0166813 A1 Jul. 7, 2011

Related U.S. Application Data

(60) Provisional application No. 61/293,104, filed on Jan. 7, 2010.

(51) Int. Cl.
*G01R 13/02* (2006.01)

(52) U.S. Cl.
CPC .................. *G01R 13/0254* (2013.01)

(58) Field of Classification Search
CPC ...... G06F 1/3206; G01R 13/02; G01R 13/32; G01R 13/208; G01R 13/0236; G01R 13/029
USPC ......... 702/66–70, 73, 82, 117, 119, 120, 183, 702/185, 189
See application file for complete search history.

(56) References Cited

U.S. PATENT DOCUMENTS

| 6,396,517 | B1 | 5/2002 | Beck | |
|---|---|---|---|---|
| 2003/0220753 | A1* | 11/2003 | Pickerd et al. | 702/67 |
| 2005/0225310 | A1* | 10/2005 | Smith et al. | 324/121 R |
| 2009/0281759 | A1* | 11/2009 | Cake et al. | 702/123 |

FOREIGN PATENT DOCUMENTS

| EP | 2293087 A2 | 3/2011 |
|---|---|---|
| JP | 2007-327745 | 12/2007 |

* cited by examiner

*Primary Examiner* — Mohamed Charioui
(74) *Attorney, Agent, or Firm* — Marger Johnson; Thomas F. Lenihan

(57) ABSTRACT

A test and measurement instrument includes an input terminal to receive a signal, acquisition circuitry to capture a plurality of triggered acquisitions, trigger circuitry to cause a trigger event responsive to trigger criteria, and a controller to dynamically reconfigure the trigger criteria between triggered acquisitions. The controller is configured to dynamically reconfigure the trigger criteria from the first set of trigger criteria to subsequent sets of trigger criteria between each of the triggered acquisitions. A method is disclosed for scanning information associated with an initial triggered acquisition and, depending on the nature of the scanned information, dynamically adjusting the next or any subsequent set of trigger criteria.

15 Claims, 10 Drawing Sheets

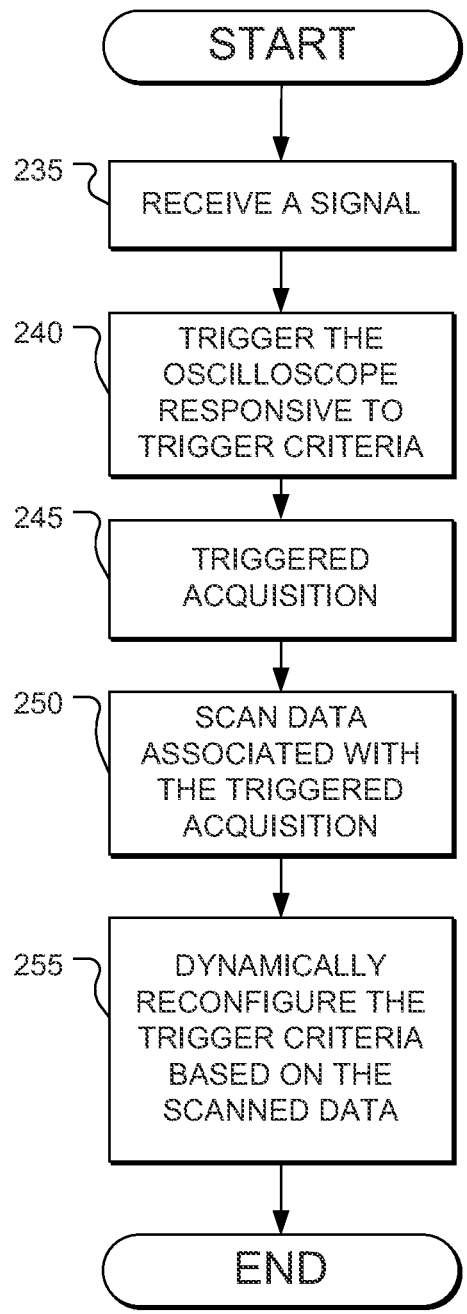

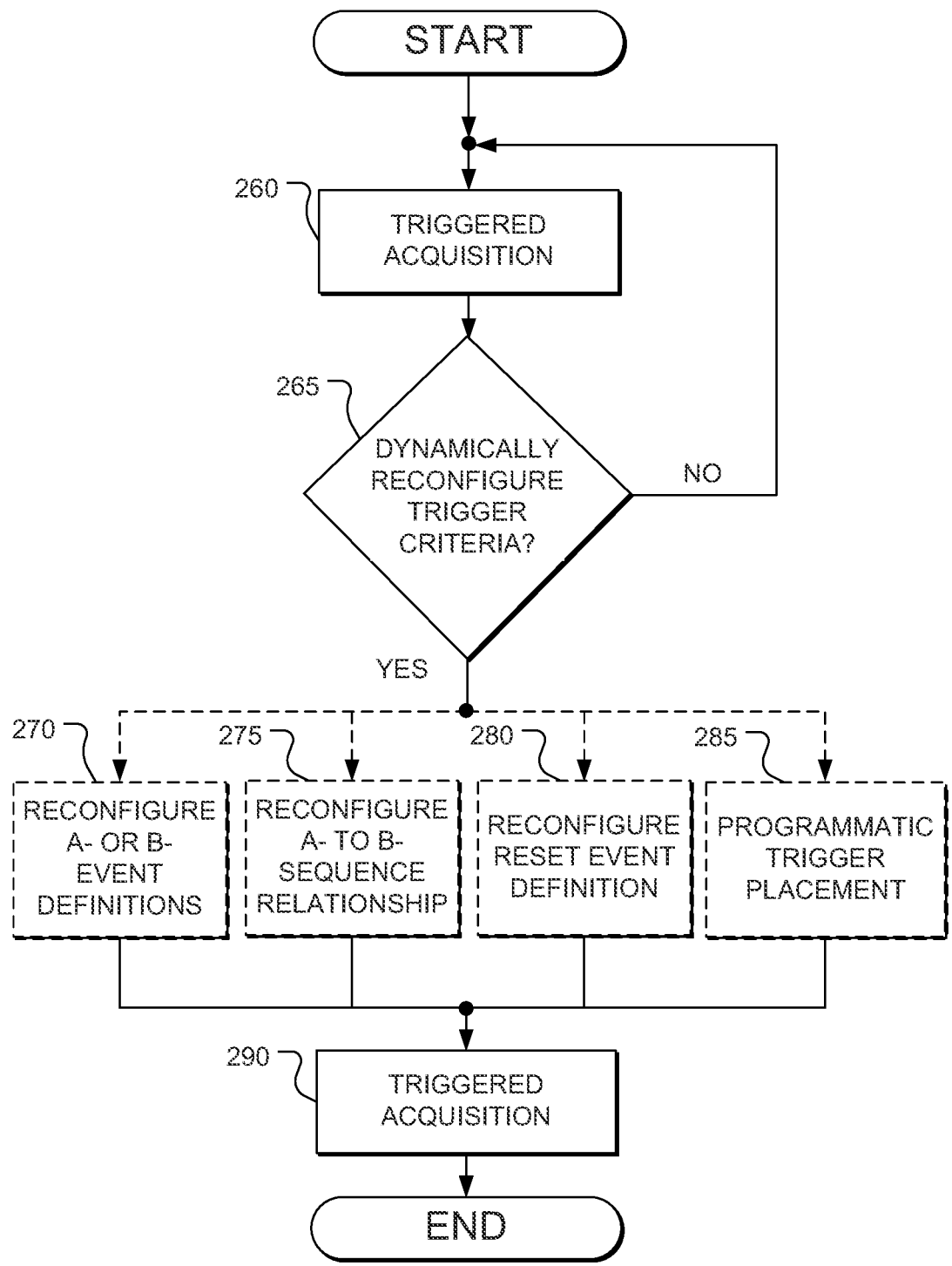

DYNAMIC OSCILLOSCOPE TRIGGERING

CROSS REFERENCE TO RELATED APPLICATION

This application claims the benefit of provisional patent application Ser. No. 61/293,104, filed Jan. 7, 2010, herein incorporated by reference.

BACKGROUND

Oscilloscopes and other types of test and measurement instruments are used in a variety of applications. For example, such instruments are used to capture and analyze electrical signals and waveforms associated with high-speed memory devices, networks, storage devices, and other advanced electrical systems and devices.

Conventional dual-trigger oscilloscopes are fixed in their definition of, and relationship between, the A- and B-Events of a dual-event trigger system. In other words, for every triggered acquisition, a specified A-Event must occur followed by a specified B-Event after a specified amount of time has elapsed or after a specified number of B-Events have occurred. Thus, every triggered acquisition intentionally captures a similar portion of the waveform based on fixed definitions of the A- and B-Events as well as on the fixed relationship between the specified A- and B-Events.

Such limitations prevent users of the oscilloscope from simultaneously analyzing different portions of the waveform associated with the triggered acquisitions. It would be desirable to dynamically update the A- and B-Event definitions during the time between subsequent triggered acquisitions. It would also be desirable to dynamically change the sequence relationship between A- and B-Events during the time between subsequent triggered acquisitions. It would further be desirable to automatically capture different portions of the waveform in a prescribed manner.

Accordingly, a need remains for methods and systems for dynamically reconfiguring trigger criteria between triggered acquisitions, and automatically capturing different portions of the waveform.

SUMMARY

Embodiments of the present invention include a method for dynamically triggering a test and measurement instrument. The method can include, for example, receiving a signal at an input terminal of the test and measurement instrument, acquiring a plurality of triggered acquisitions, triggering the test and measurement instrument responsive to trigger criteria, and dynamically reconfiguring the trigger criteria between at least two of the triggered acquisitions. In other words, the trigger criteria can be reconfigured from an initial set of trigger criteria to subsequent sets of trigger criteria between each of the triggered acquisitions. The trigger criteria can include, for example, A-Event and B-Event definitions, A-to-B Event sequence relationships, reset event definitions, and/or programmatic adjustments to the trigger placement, among other suitable trigger criteria.

The method can include scanning or otherwise examining information associated with the first triggered acquisition and, depending on the nature of the scanned information, automatically adjusting the subsequent sets of trigger criteria. For instance, the B-Event trigger type or placement can be adjusted based on the examination of the acquired data.

The method can further include adjusting a repetition factor to control the number of individual single waveforms associated with each set of trigger criteria, and based on the repetition factor, controlling a rate at which the waveforms are displayed.

Also disclosed is a test and measurement instrument, which can include an input terminal to receive signals under test, acquisition circuitry to capture triggered acquisitions, trigger circuitry to cause a trigger event responsive to trigger criteria, and a controller to dynamically reconfigure the trigger criteria between triggered acquisitions.

BRIEF DESCRIPTION OF THE DRAWINGS

FIGS. 2A-2C illustrate flow diagrams showing techniques for dynamically adjusting trigger criteria in accordance with some embodiments of the invention.

DETAILED DESCRIPTION

Reference is made herein to a test and measurement instrument. The test and measurement instrument can implement or include various example embodiments of the present invention, which can be applied in a variety of ways and to a variety of different applications, including for example, the measurement and analysis of signals associated with high-speed memory, storage devices, networks, and so forth, and/or to detect and analyze anomalies such as cross-talk or other electrical noise. In addition, the test and measurement instrument as described herein can be used for dynamically updating A- to B-Event definitions during the time between subsequent triggered acquisitions, thereby dynamically capturing different portions of the waveform in a prescribed manner.

Moreover, embodiments of the present invention include dynamically changing the sequence relationship between A- and B-Events during the time between subsequent triggered acquisitions. Depending on the nature of the acquired data, the trigger definitions or criteria can be dynamically changed. Any number of waveforms at one particular trigger definition or set of criteria can be collected before dynamically changing to the next trigger definition so that the waveforms can be clearly defined at each trigger definition or set of criteria.

Trigger criteria can be dynamically reconfigured between triggered acquisitions, thereby automatically capturing different portions of the waveform, and providing the ability to simultaneously display and analyze the captured waveforms associated with one or more electrical signals under test. It is contemplated that the test and measurement instrument is an RT (Real Time) digital oscilloscope or other suitable test and measurement instrument. For the sake of brevity and consistency, but not limitation, the test and measurement instrument will generally be referred to herein as an oscilloscope.

Figure 1:
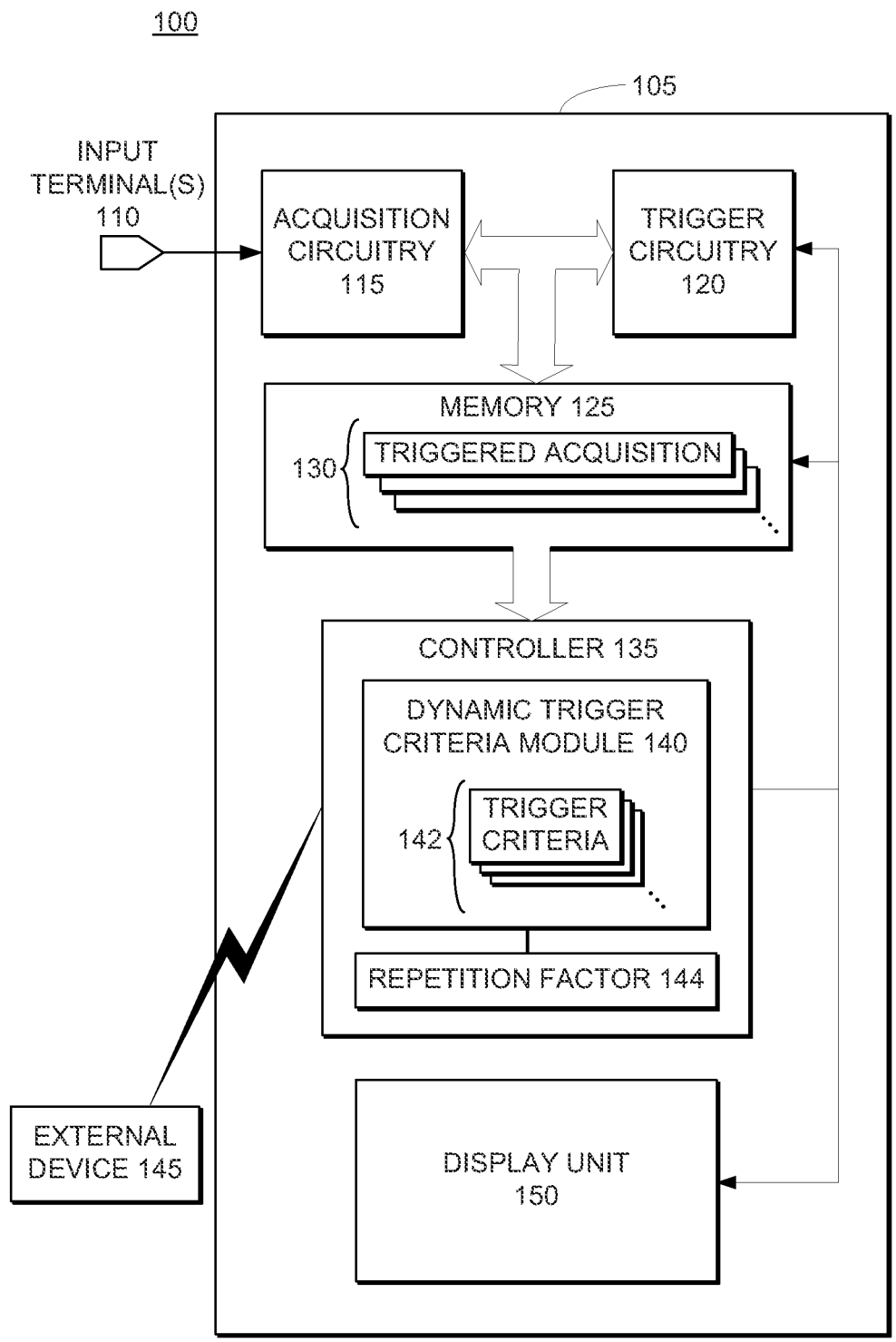
FIG. 1 illustrates a simplified block diagram of one embodiment of a test and measurement instrument according to the present invention, including an input terminal, acquisition circuitry, trigger circuitry, memory, a controller including a dynamic trigger criteria module, and a display unit, according to embodiments of the present invention.

FIG. 1 illustrates a simplified block diagram 100 of one embodiment of a test and measurement instrument 105 according to the present invention. The test and measurement instrument 105 will generally be referred to herein as oscilloscope 105. The oscilloscope 105 can include, for example, one or more input terminals 110, acquisition circuitry 115, trigger circuitry 120, memory 125, a controller 135 including a dynamic trigger criteria module 140, and a display unit 150, according to some embodiments of the present invention.

The oscilloscope 105 may have one, two, four, or any number of channels or inputs 110, suitable for use with various embodiments as described herein. While components of the oscilloscope 105 are shown to be directly coupled to each other, it should be understood that the oscilloscope 105 can include a variety of other circuit or software components, inputs, outputs, and/or interfaces, which are not necessarily shown, but that are disposed between or otherwise associated with the illustrated components of oscilloscope 105.

One or more electrical signals under test are received at the input terminals 210. Acquisition circuitry 115 acquires and digitizes the signals. Trigger circuitry 120 triggers the oscilloscope 105 in response to the signals and trigger criteria. The digitized signals are stored in memory 125 in the form of triggered acquisitions 130. Each triggered acquisition 130 can correspond to one trigger definition or set of trigger criteria.

A controller 135 is operatively coupled to the trigger circuitry 120, the memory 125, and the display unit 150. The controller 135 processes the signals under test, and produces corresponding waveforms, traces, and/or measurements for display by the display unit 150. More specifically, the controller includes dynamic trigger criteria module 140. Any of the components of the controller 135 and/or the dynamic trigger criteria module 140 may exist in or be implemented using hardware, software, firmware, or by any combination thereof.

The dynamic trigger criteria module 140 of the controller 135 can dynamically update the trigger criteria 142 during the time between each of a series of triggered acquisitions 130. The terms "trigger criteria" or "set of trigger criteria" are used herein to refer to criteria by which the oscilloscope 105 is triggered, and can include for example various components such as trigger definitions of A- and/or B-Events, sequence relationships between A- and B-Events, reset event definitions, and/or programmatic criteria. For example, trigger criteria 142 can include trigger type, sequence method or parameter values, length of timer events, circuit polarities, trigger level voltage or equivalent, among other trigger definitions and/or relationships. The sequence relationships can include, for example, delay by time or delay by event parameter values. The reset event definitions can include, for example, timeout, transition, and/or level parameter values, and if the reset occurs before the B-Event, it can cause the trigger to go back to the A-Event. Some or all of these comprise what is referred to herein as the trigger criteria or set of trigger criteria.

The dynamic trigger criteria module 140 can automatically and dynamically reconfigure the trigger criteria 142 between at least two of the triggered acquisitions. For instance, where a first set of trigger criteria 142 is established, the trigger circuitry 120 can cause a trigger event responsive to the first set of trigger criteria 142, and the display unit 150 can display a waveform associated with the corresponding trigger event in which the first set of trigger criteria is satisfied. The dynamic trigger criteria module 140 can automatically and dynamically reconfigure the trigger criteria 142 from the first set of trigger criteria 142 to subsequent sets of trigger criteria 142 between each of the triggered acquisitions 130, and the display unit 150 can simultaneously display waveforms associated with the corresponding trigger events in which the subsequent sets of trigger criteria are satisfied. In other words, the trigger circuitry 120 can automatically and dynamically trigger on each of the subsequent sets of trigger criteria 142 without intervening manual reconfiguration of the trigger criteria, and all of the corresponding waveforms can be simultaneously displayed for analysis.

In some embodiments, after having established an initial set of trigger criteria 142 including, for example, definitions for the A- and B-Events, and the sequence relationship between the A- and B-Events, the dynamic trigger criteria module 140 can scan the initial triggered acquisition 130 for waveform data before or after the triggered event, and depending on the nature or content of the scanned data or portions of the scanned data, the dynamic trigger criteria module 140 can then be programmatically changed. For example, the B-Event definition can be changed by virtue of trigger placement or type. For instance, the location of the trigger placement of the B-Event definition component of the trigger criteria 142 can be programmatically changed based on the scanned data. As another example, the B-Event definition component of the trigger criteria 142 can be programmatically changed from window trigger definition to a slope edge trigger based on the scanned data. Different waveforms corresponding to the various programmatically determined trigger types or placements can then be simultaneously displayed using the display unit 150. In some embodiments, the different waveforms are programmatically "shifted" on the display to correspond to the new trigger placement or type.

In some embodiments, the acquired data can be examined after the trigger occurs, and the controller can determine whether to keep or abandon the current triggered acquisition 130 and/or to set new trigger criteria 142 for the next triggered acquisition. Thus, the trigger criteria 142 can be dynamically changed depending on the nature of the acquired data resulting from the trigger definition or criteria. For instance, after a first triggered acquisition is captured in accordance with a first set of trigger criteria 142, using the acquisition circuitry 115, then the controller can scan information associated with the first triggered acquisition and, depending on the nature of the scanned information, automatically adjust the B-Event component of the subsequent sets of trigger criteria 142. The first triggered acquisition 130 is associated with the first set of trigger criteria 142 and the remaining triggered acquisitions 130 are associated with one of the subsequent sets of trigger criteria 142. Between any two of the triggered acquisitions 130, the data can be scanned and the next or any subsequent trigger criteria adjusted based on the scanned data.

In some embodiments, dynamically reconfiguring the trigger criteria 142 can include changing any component associated with the trigger criteria 142. For example, after having established an initial set of trigger criteria 142 including, for example, definitions for the A- and B-Events, and the sequence relationship between the A- and B-Events, the trigger circuitry 120 triggers the oscilloscope 105 in accordance with the initial set of criteria 142. Any component of the trigger criteria can then be dynamically reconfigured before the next or any subsequent triggered acquisition 130 without intervening manual reconfiguration. The trigger circuitry 120 can trigger on the initial and/or the subsequent trigger criteria 142 and display one or more waveforms corresponding to the triggered events.

The display unit 150 simultaneously displays a waveform associated with the first set of trigger criteria 142 and a plurality of additional waveforms, each additional waveform being associated with one of the subsequent sets of trigger criteria 142. The term "waveform" as used herein normally refers to a group of individual single waveforms that essentially comprise a "general" waveform or portion of a general waveform. Any number of individually gathered single waveforms can be collected at one particular trigger definition, or in accordance with one particular set of trigger criteria, before dynamically changing to the next trigger definition or set of criteria, so that the general waveforms are more clearly defined at each trigger definition or set of trigger criteria.

The number of single waveforms captured can be determined using repetition factor 144, which can be dynamically or manually configured. The repetition factor 144 is operatively associated with the dynamic trigger criteria module 140. By increasing the repetition factor 144, the number of individual single waveforms making up the general waveform is increased, which better defines and more clearly shows the character of the general waveform. Multiple different individual single waveforms are combined to form the general waveform corresponding to one of the triggered acquisitions 130.

Furthermore, the additional gathering of individual single waveforms causes an increase in the amount of time to acquire all of the data associated with a particular set of trigger criteria; as a result, a user of the oscilloscope 105 can perceive an incremental progression of additional waveforms being displayed by the display unit 150 according to evolving sets of trigger criteria. In this manner, the user can visually perceive at which moment or position a particular waveform violates an expected pattern. More specifically, if a user of the oscilloscope sets the repetition factor 144 to 100 or 1000, for example, then the progression from one set of trigger criteria to the next set of trigger criteria is slowed to the point that each change in the trigger criteria is visually noticeable to the user because of the gradual addition of waveforms on the display. An indicator such as an icon or textual information can be displayed to convey the current repetition factor 144 to the user of the oscilloscope 105.

Different "portions" of the same general waveform can be simultaneously displayed on the display unit 150. In addition, different portions of different general waveforms can be simultaneously displayed on the display unit 150. In some embodiments, where multiple channels of the oscilloscope 105 receive multiple signals, the trigger criteria 142 can be configured to cover events occurring on any one or more of the signals, and therefore, it is useful to the user of the oscilloscope to simultaneously observe the different portions of the waveforms satisfying the first and subsequent sets of trigger criteria.

In some embodiments, the sequence relationship between A- and B-events are dynamically changed by the dynamic trigger criteria module 140 during the time between subsequent triggered acquisitions. For instance, the sequence relationship for delay time or delay event count may be changed using a variety of methods, including increment, decrement, random, toggled, computed, and/or listed manner, among other suitable sequence relationships. By dynamically changing the A- to B-Event relationship, different portions of the general waveform are captured in a prescribed manner.

In some embodiments, any component of the sets of trigger criteria 142 is dynamically changed between triggered acquisitions 130. For example, where an initial set of trigger criteria includes definitions for A- and B-Events and a particular sequence relationship between them, each of the subsequent sets of trigger criteria 142 can be represented by $C_X$, where X represents a particular set of trigger criteria 142, and changes or otherwise advances or increments from 1 to the number of sets of subsequent trigger criteria 142. The change in X represents a dynamic change in any of the components or definitions of the trigger criteria. In other words, any definition or relationship can be changed, such as the A- and B-Event definitions, the sequence relationship between the events, the reset event definition, and/or programmatic changes to the trigger placement or type based on scanned data. When X changes between each triggered acquisition 130, a new set of trigger criteria $C_X$ can be applied.

In some embodiments, the sequence relationship between the A- and B-Event components of the sets of trigger criteria 142 is dynamically changed between triggered acquisitions 130. For example, where an initial set of trigger criteria 142 includes an A-Event and a B-Event, each of the subsequent sets of trigger criteria 142 can include a $B_X$-Event. X represents a particular sequence relationship component of the set of trigger criteria 142, and changes or otherwise advances or increments from 1 to the number of sets of subsequent trigger criteria 142. The change in X represents a dynamic change in the sequence relationship between the A- and B-Event components of the sets of trigger criteria. Each new set of trigger criteria 142 represented by the change in X can also include a dynamic change in the sequence relationship between the A- and B-Events, as discussed above.

In some embodiments, the controller 135 can receive trigger criteria 142 from external device 145 via a conductor such as a bus or a wire. The external device 145 can include, for example, a computer separate from the oscilloscope 105, or an external memory device, among other possibilities. Alternatively, or in addition to, the controller 135 can transmit information about or included in the triggered acquisitions 130 to the external device 145.

Figure 2A:
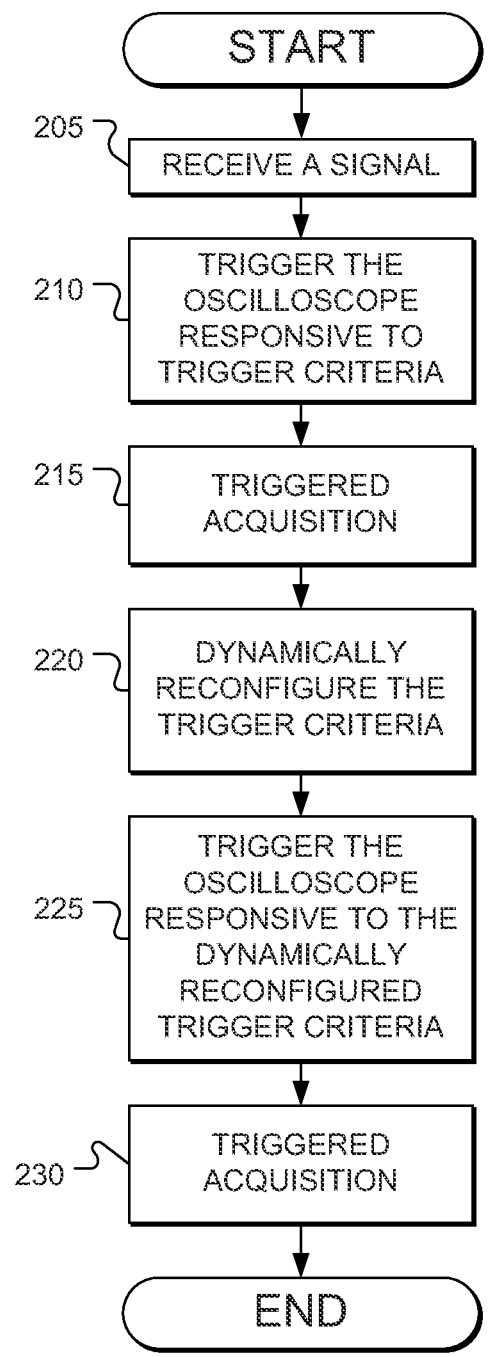

FIGS. 2A-2C illustrate flow diagrams showing techniques for dynamically adjusting trigger criteria in accordance with some embodiments of the invention.

In FIG. 2A, the flow begins at 205 where a signal under test is received at an input terminal of the oscilloscope. At 210, the oscilloscope is triggered responsive to trigger criteria, which can include any definition or relationship discussed above. At 215, a triggered acquisition is captured using the trigger circuitry and the memory of the oscilloscope. The flow then proceeds to 220 where the trigger criteria is dynamically reconfigured, as also discussed above. Then, at 230, one or more additional triggered acquisitions occur.

In FIG. 2B, the flow begins at 235 where a signal under test is received at an input terminal of the oscilloscope. At 240, the oscilloscope is triggered responsive to trigger criteria, which can include any definition or relationship discussed above. At 245, a triggered acquisition is captured using the trigger circuitry and the memory of the oscilloscope. The data associated with the triggered acquisition, which can include data before or after the trigger event, is scanned or otherwise examined at 250. Based on the scanned data, the trigger criteria can be dynamically reconfigured at 255. In some embodiments, the acquired data can be examined and a determination made whether to keep or abandon the triggered acquisition, and/or whether and how to reconfigure the trigger criteria.

In FIG. 2C, the flow begins at 260 where a triggered acquisition is captured using the trigger circuitry and the memory of the oscilloscope. At 265, a determination is made whether to dynamically reconfigure the trigger criteria. If NO, the flow returns to 260 and another triggered acquisition occurs. Otherwise, if YES, the flow proceeds to one or more of blocks 270, 275, 280, and 285. At 270, the A-Event and/or the B-Event definitions are reconfigured. At 275, the A-to-B Event sequence relationship is reconfigured. At 280, the reset event definition is reconfigured. At 285, the trigger placement is programmatically reconfigured. Any one or more of these definitions or relationships can be automatically and dynamically reconfigured between triggered acquisitions 260 and 290 without intervening manual reconfiguration.

Figure 3:
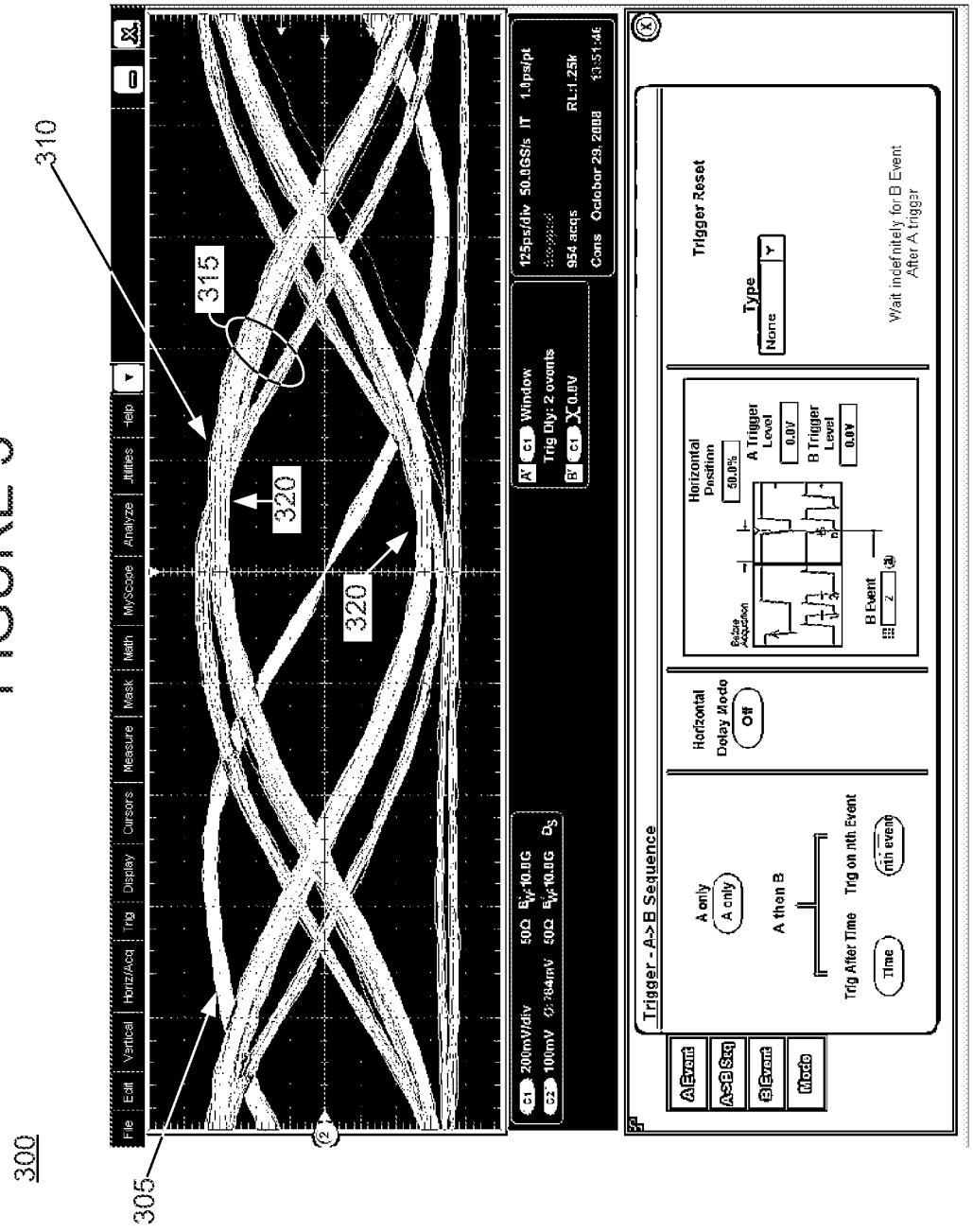
FIG. 3 illustrates an example trace of a single data eye waveform about a single clock transition waveform.

FIG. 3 illustrates an example trace 300 of a single data eye waveform 310 about a single clock transition waveform 305. The single data eye 310 shows portions 320 of a general waveform 310, and although the general waveform 310 is made up of individually gathered single waveforms 315, it should be understood that the data eye 310 as discussed herein is derived from a single general waveform.

The waveforms shown in FIG. 3 are generally related to a DDR3 memory device and are provided as an illustrative example. A first or initial trigger setup to capture a single data eye 310 uses an A-Event Window Trigger to detect a DDR3 Write and/or Read event associated with the DQS clock signal on channel CH1 of the oscilloscope 105. Channel is generally abbreviated herein as CH. Each channel, such as CH1 of the oscilloscope, can be associated with a corresponding one of the input terminals 110.

The A-Event Window Trigger is followed by a B-Event "Either Slope Edge Trigger" on the DQS clock signal on CH1 by specifying a fixed "Trig on nth Event" value of two to capture the DQ CH2 data eye surrounding the second DQS clock (of CH1) as shown in FIG. 3. Thus, a single data eye associated with the signal received through CH1 is displayed about a single clock transition associated with a clock signal received through CH2. Although it is useful to examine this single data eye 310 about a single clock transition 305, it is more useful to examine multiple overlapped data eyes at multiple clock transitions, as described with reference to FIG. 4.

Figure 4:
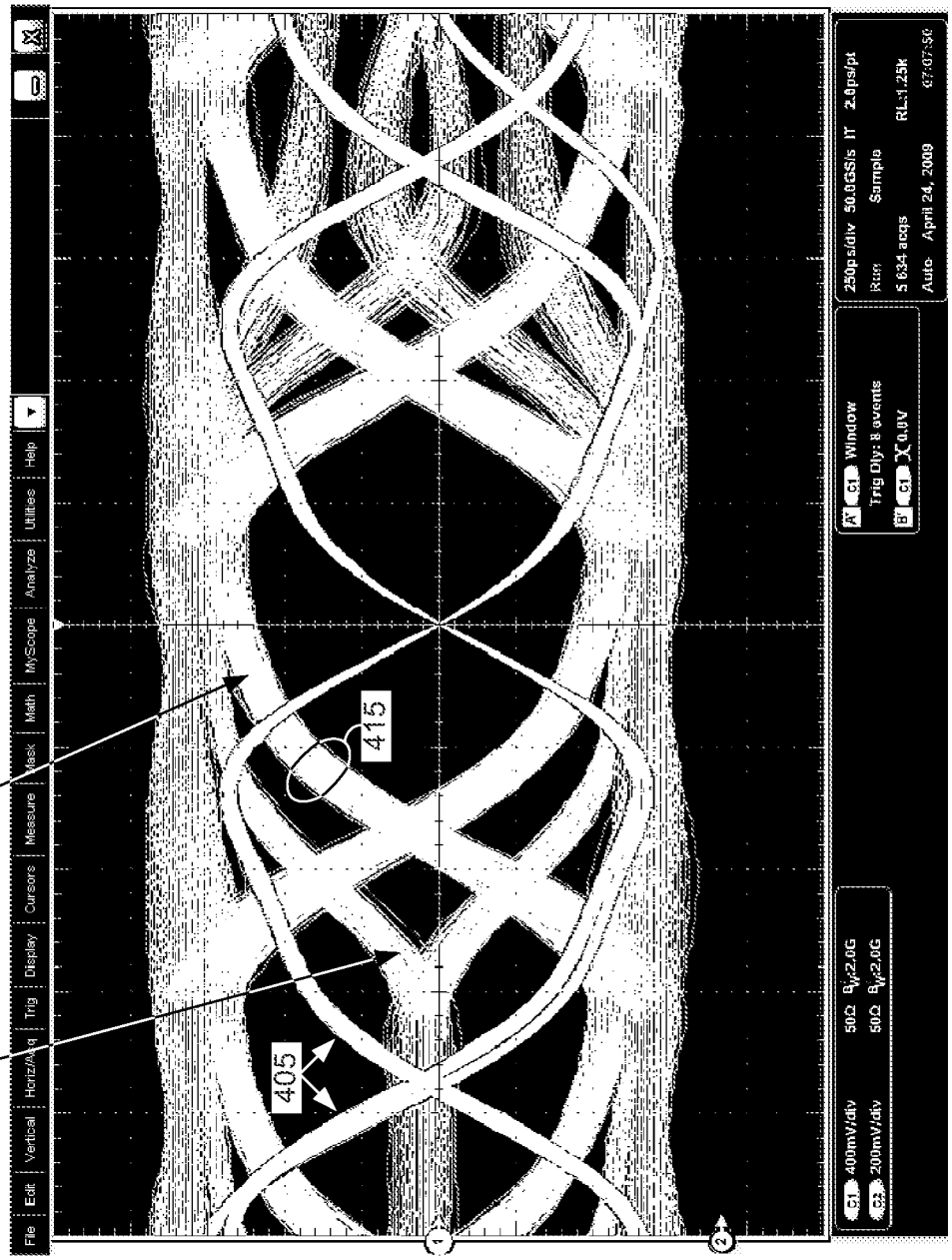
FIG. 4 illustrates an example trace of multiple data eye waveforms about multiple clock transitions according to some embodiments of the present invention.

FIG. 4 illustrates an example trace 400 of multiple data eye waveforms (e.g., 410/412) about multiple clock transitions 405 according to some embodiments of the present invention. Here, not only the number of the B-Events is dynamically modified, but also the circuit polarity of those B-Events is alternated. Instead of a single waveform data eye displayed a fixed number of events after a first trigger condition (i.e., A-Event) as shown in FIG. 3, a set of overlapped waveform data eyes 410/412 are captured at a dynamically varying number of B-Events delayed from the A-Event. In this way, the characteristics of the multiple data eyes can be examined simultaneously rather than sequentially. In this example, the overlapped data eyes are found in a pair of DDR3 signals, where the CH1 is associated with the DQS clock signal 405 and the CH2 is associated with the data signal resulting in waveforms 410/412.

A user of the oscilloscope 105 can determine, for example, that the CH2 data eyes are shifted or otherwise not open by the same amount, which can be a key design consideration in a DDR3 memory system. For example, the user can determine how close the data eyes are encroaching on the clock. The overlapped DQ data eyes can be achieved by dynamically changing the "Trig on nth Event" value from one to eight between subsequent acquisitions, while triggering on alternating slopes of the DQS clock signal. Thus, FIG. 4 shows in essence a summary of all eight data eyes about the burst of eight clock transitions following the initial DDR Write and/or Read Event. Dynamically changing the trigger criteria between subsequent triggered acquisitions enables the simultaneous display of the multiple data eyes and clock waveforms.

The overlapped data eyes can be acquired at trigger hardware speed, providing a comprehensive summary of the signal characteristics in a relatively short amount of time. Multiple single waveforms 415 are automatically captured in accordance with each set of trigger criteria before proceeding to the next set of trigger criteria in order to clearly and repeatedly define the corresponding triggered general waveform.

In some embodiments, the waveform 410 associated with the first set of trigger criteria comprises a first portion of a general waveform 410. Each of the additional waveforms (e.g., 412) associated with the subsequent sets of trigger criteria comprises an additional different portion of the same general waveform. The general waveform corresponds to the data signal received at the input terminal, in this case, through CH2. The display unit 150 is configured to simultaneously display the first portion 410 and the additional different portions 412 of the general data waveform associated with the signal received at the input terminal.

Figure 5:
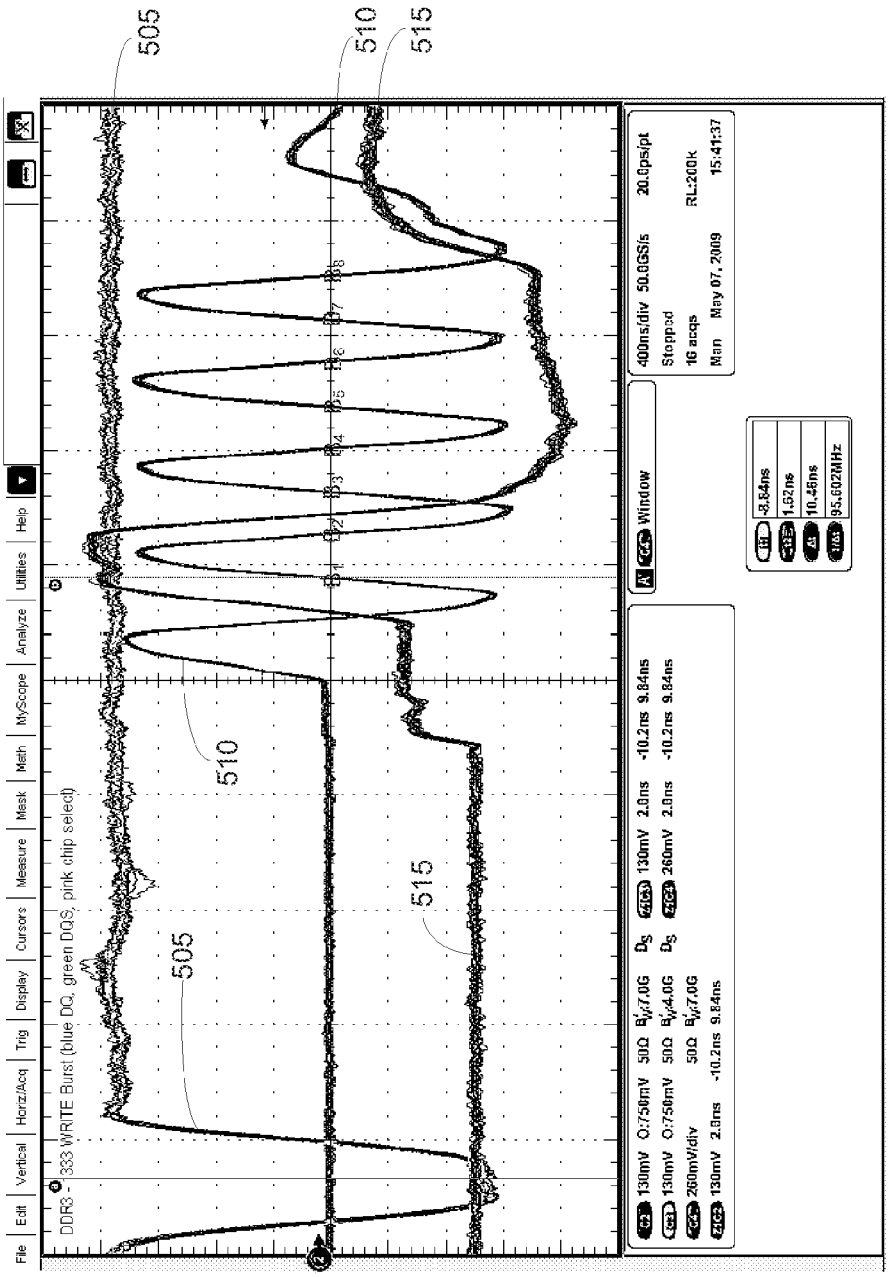
FIG. 5 illustrates an example trace of the relationship between three different signals associated with a DDR3 memory chip according to some embodiments of the present invention.

FIG. 5 illustrates an example trace 500 of the relationship between three different signals associated with a DDR3 memory chip according to some embodiments of the present invention. In this example embodiment, it is explained how separate data eyes from different "ranks" of DDR memory chips can be captured and simultaneously displayed. To show the preliminary relationships among the rank and/or chip select (~CS), clock (DQS), and data (DQ) signals, a Window Trigger can be used as the initial B-Event. The rank and/or chip select (~CS) is generally referred to herein as the rank select.

The rank select signal 505 of the DDR3 memory system is associated with a window trigger definition configured to the clock signal 510 so that events from one rank can be triggered or otherwise captured. The low-going pulse on the rank select signal 505 associated with CH3 can be targeted by the A-Event, and the first rising (or falling) edge of the clock signal 510 associated with CH4 can be targeted by the B-Event. A delay by time sequence relationship can be configured between the A- and B-Events. In this manner, a burst of Write and/or Read operations associated with a particular rank or chip can be analyzed. The data signal 515 associated with CH2 forms the desired overlapped set of data eyes about the CH4 clock transitions (e.g., $B_1, B_2, B_3, B_4, B_5, B_6, B_7, B_8$) after the B-Event trigger type is dynamically changed from Window Trigger to "Either Slope" Edge Trigger, thereby resulting in the overlapped data eyes as illustrated in FIG. 4.

The first or initial trigger criteria can include an A-Event Negative Glitch and/or Pulse Width trigger criteria component to detect the low-going pulse on the rank select signal 505 (~CS) associated with CH3, sequenced to a B-Event Positive Polarity Window trigger criteria component associated with CH2, by a fixed amount of A-to-B-Event delay time. The amount of A-to-B-Event delay time thus captures the activity on a particular rank of DDR3 memory chips. After the trigger criteria is satisfied and the trigger occurs, the clock signal 510 associated with CH4 is scanned for the next or any subsequent rising (or falling) edge, and the B-Event component of the trigger criteria is reconfigured to place the B-Event trigger component at such edge to again capture the next portion of the general data waveform 515, thereby producing the overlapped set of data eyes as illustrated in FIG. 4. In other words, the dynamic trigger criteria module 140 of FIG. 1 can be used to effect a dynamic change from a B-Event Window Trigger to a B-Event "Either Slope Edge Trigger" by dynamically reconfiguring the B-Event component of the trigger criteria between triggered acquisitions by virtue of trigger placement.

In some embodiments, only a small amount of waveform data scanning needs to occur after the B-Event Window Trigger component of the trigger criteria. After scanning the small amount of data, the dynamic trigger criteria module 140 can determine where to place the next or any subsequent B-Event "Either Slope Edge Trigger" at the different edges in the burst of high and low clock signals 510. It should be understood that large amounts of acquired data need not be searched, which is computationally expensive and slow. Rather, the separation of DDR3 memory chip ranks, and information related thereto, can be accomplished at near trigger hardware speed.

In some embodiments, multiple input terminals 110 are used and are associated with multiple channels of the oscilloscope 105. A first signal 505 is received over one channel, a 510 clock signal is received over another channel, and a data signal 515 is received over yet another channel. Each channel of the oscilloscope is associated with one of the input terminals 110. The first or initial set of trigger criteria includes an A-Event associated with the first signal 505 sequenced to a B-Event associated with the clock signal 510. Each of the subsequent sets of trigger criteria includes a $B_X$-Event associated with the data signal 515, wherein X is configured to change or otherwise advance or increment from 1 to the number of subsequent sets of trigger criteria, and the change in X represents a dynamic change in the sequence relationship between the A- and B-Event components of the sets of trigger criteria. Each new set of trigger criteria 142 represented by the change in X can also include a dynamic change in the sequence relationship between the A- and B-Events, as discussed above.

The waveform associated with the first set of trigger criteria comprises a portion 405 of a general waveform 510 of the clock signal 510. The waveforms associated with each of the subsequent sets of trigger criteria comprise different portions 410/412 of a general waveform 515 of the data signal 515. The display unit 150 is configured to simultaneously display the portion 405 of the general waveform 510 of the clock signal 510 and the different portions 410/412 of the general waveform 515 of the data signal 515.

With reference to the DDR3 example discussed above, the acquired data can be examined after the trigger occurs, and the controller can determine whether to keep or abandon the current triggered acquisition and/or to set new trigger criteria for the next triggered acquisition.

Figure 6:
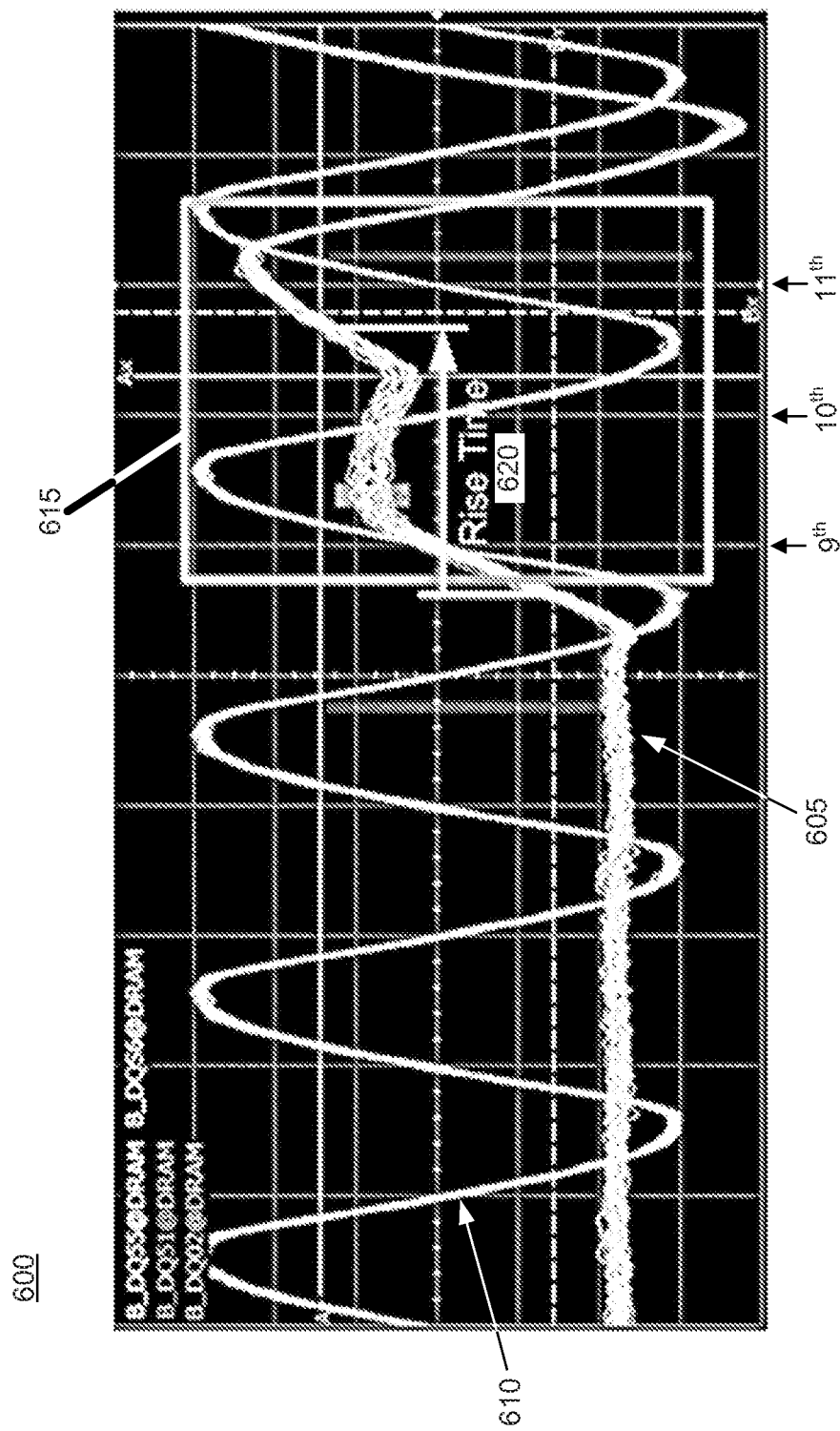
FIG. 6 illustrates an example trace of a data signal in which a region is determined to be invalid according to some embodiments of the present invention.

FIG. 6 illustrates an example trace 600 of a data signal 605 in which a region 615 is determined to be invalid according to some embodiments of the present invention. Box 605 delineates a general region in the signal set where the DQ data signal 605 is not valid between the 9th and 11th DQS clock edges of clock signal 610 associated with CH4. Having just triggered on the 9th clock DQS rising edge, the scope can examine the acquired data for the DQ data signal 605 associated with CH1 to determine whether its transition time from low to high threshold is too long or otherwise too slow. In the example shown in FIG. 6, the transition time is determined to be invalid for this reason. With such information, the scope trigger logic can decide whether to keep or abandon this particular acquisition, and/or whether to decline to advance the sequence event number component of the dynamic trigger criteria 142. The scope trigger circuitry then re-arms to look for the next region where the signal set does contain valid DQ data at the 9th and subsequent DQS clock edges. In this way, the overlapping DQ data eyes about all DQS clock edges in the range containing only valid DQ data can be obtained.

Figure 7:
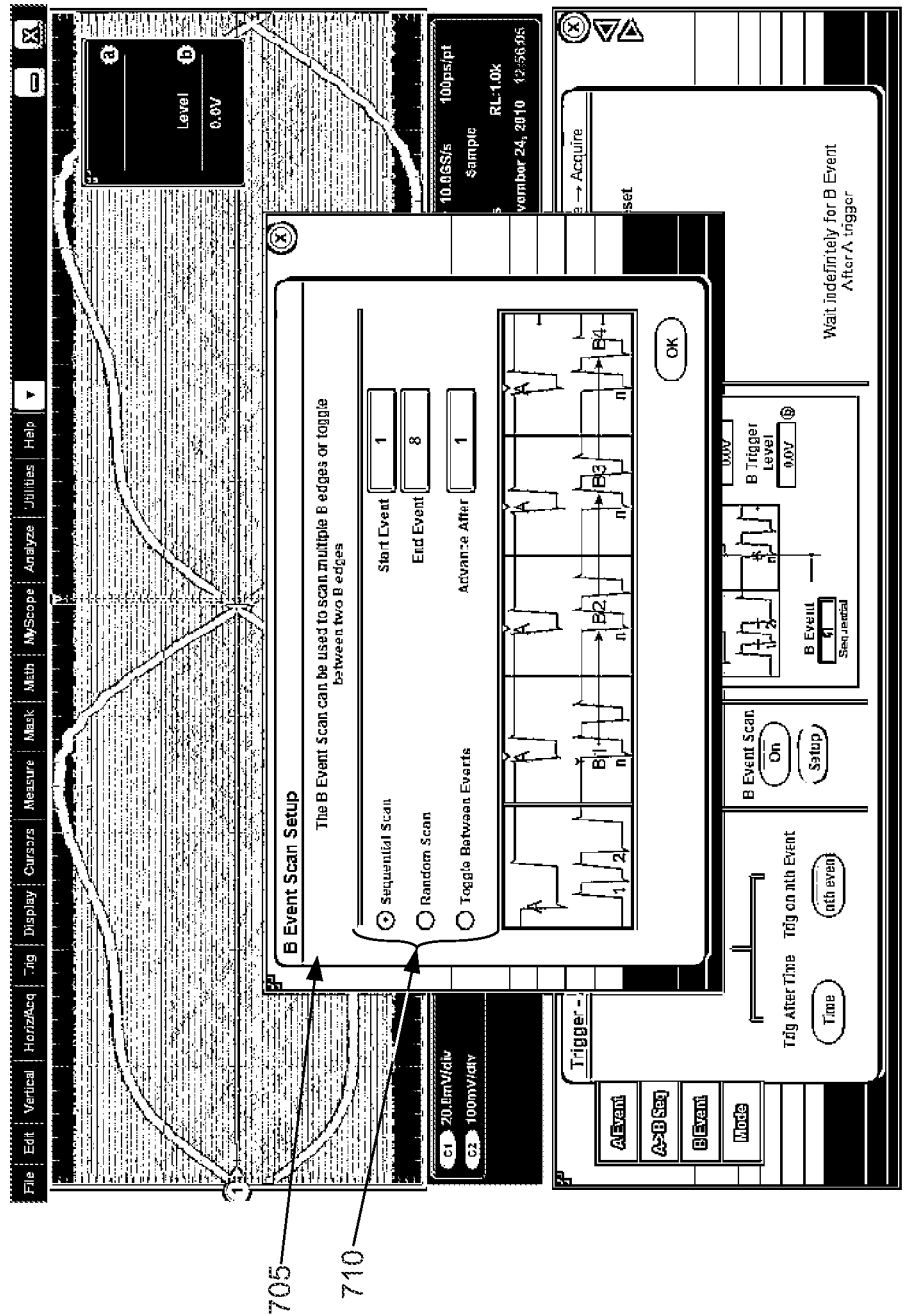
FIG. 7 illustrates one example embodiment of an enable button and setup control window for configuring one or more dynamic triggering setting according to some embodiments of the present invention.

FIG. 7 illustrates one example embodiment of an enable button and setup control window 700 for configuring one or more dynamic triggering settings 710 according to some embodiments of the present invention. This example embodiment of a control window 700 allows a user of the oscilloscope 105 to configure the A- and B-Event components of the trigger criteria, and to specify how the trigger criteria will dynamically change between triggered acquisitions. In this example, the A-to-B Sequence Event count can be configured to support the DDR3 overlapped eye diagram example. Also, the B-Event Scan can be used to scan multiple B edges, either sequentially or randomly, or toggle between B edges. It should be understood that hundreds of A-to-B sequence trigger combinations (not shown) can be implemented using the dynamic triggering techniques disclosed herein, for example, based on combinations of the various A- and/or B-Event definitions, the A-to-B sequence relationships, the reset event definition, the programmatic trigger placement, and so forth.

Figure 8:
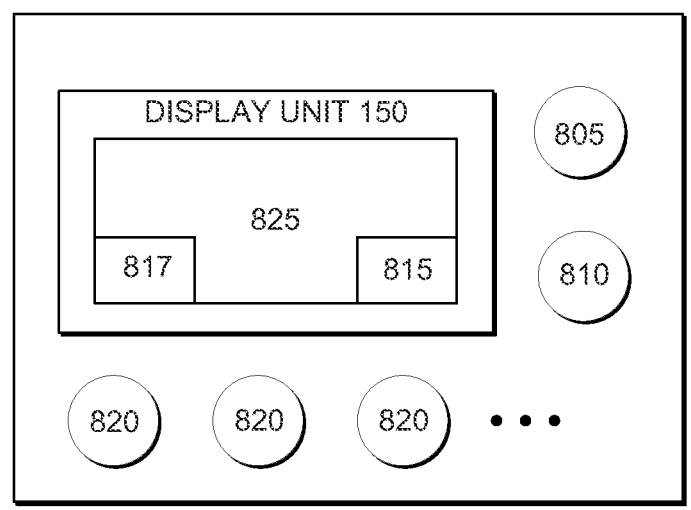
FIG. 8 illustrates a test and measurement instrument including inputs for configuring the dynamic triggering settings according to some embodiments of the invention.

FIG. 8 illustrates an oscilloscope 800 including inputs 805, 810, 815, and/or 820 for configuring the dynamic triggering settings according to some embodiments of the invention. The oscilloscope 800 includes the display unit 150 having display 825. Inputs 805, 810, and/or 820 can be used to configure initial trigger criteria. For example, input 805 can be used to configure A-Event and/or B-Event definitions, input 810 can be used to configure A-to-B Event sequence relationships, and input 820 can be used to configure reset event definitions, or any other trigger criteria. In addition, the inputs can be used to set guidelines for how the dynamic trigger criteria module will programmatically change from one set of trigger criteria to the next based on the scanned data.

Moreover, menu and/or control 815 can be used to receive input from the user through the display 825. For instance, an "analyze" menu option can have specific predefined trigger criteria, such as "DDR3" dynamic trigger criteria. In this manner, a user would need only select the DDR3 dynamic trigger menu option or a "run" button and an application would select an ideal set of trigger criteria and/or other guidelines specifically designed for DDR3 memory. It should be understood that any entry in the "analyze" menu option can have predefined settings for a particular application. It should also be understood that hundreds of combinations of trigger definitions, sequence relationships, reset event definitions, and so forth, are possible. Further, status information 827 can be used to convey information about the trigger criteria to the user, such as the repetition factor, current trigger criteria, and/or other suitable status information.

Although particular embodiments have been described, it will be appreciated that the principles of the invention are not limited to those embodiments. In some embodiments, an article drawn from the set including floppy disks, optical disks, fixed disks, volatile memory, non-volatile memory, random access memory, read-only memory, or flash memory, comprising a machine-accessible medium having associated instructions that, when executed in a test and measurement instrument, results in a machine performing the steps of the various embodiments of the invention as disclosed herein. Other variations and modifications may be made without departing from the principles of the invention as set forth in the following claims.

The invention claimed is:

1. A test and measurement instrument, comprising:
an input terminal to receive a signal;
acquisition circuitry to capture a plurality of triggered acquisitions;
trigger circuitry to cause a trigger event responsive to trigger criteria, wherein:
the trigger criteria comprises a first set of trigger criteria, and
the trigger circuitry is configured to trigger on each of subsequent sets of trigger criteria; and
a controller configured to dynamically reconfigure the trigger criteria from the first set of trigger criteria to the subsequent sets of trigger criteria between each of the triggered acquisitions, wherein the controller is operable to reconfigure the trigger criteria in dependence upon the acquired data, wherein the controller is further configured to cause the simultaneous display of:
a waveform associated with the first set of trigger criteria; and
a plurality of additional waveforms, each additional waveform associated with one of the subsequent sets of trigger criteria so that the waveforms associated with each trigger criteria are overlapped in a single accumulated view of different portions of the signal.

2. The test and measurement instrument of claim 1, wherein the input terminal comprises a first input terminal, the signal comprises a first signal, and the test and measurement instrument further comprises:
a second input terminal to receive a second signal, wherein the second signal is a clock signal;
a third input terminal to receive a third signal;
wherein:
the first set of trigger criteria includes an A-Event associated with the first signal sequenced to a B-Event associated with the clock signal;
each of the subsequent sets of trigger criteria includes a $B_X$-Event associated with the third signal,
wherein X is configured to advance from 1 to the number of subsequent sets of trigger criteria, and the change in X represents a dynamic change in the sequence relationship between the A- and B-Event components of the sets of trigger criteria.

3. The test and measurement instrument of claim 2, wherein the controller is configured to:
dynamically change the sequence relationship between the A-Event and the B-Event between at least two of the plurality of triggered acquisitions.

4. The test and measurement instrument of claim 3, wherein the sequence relationship includes at least one of increment, decrement, random, toggled, computed, and listed manner.

5. The test and measurement instrument of claim 2, wherein:
the waveform associated with the first set of trigger criteria comprises a portion of a general waveform of the clock signal;
the waveforms associated with each of the subsequent sets of trigger criteria comprise different portions of a general waveform of the third signal; and
the controller is configured to cause the simultaneously display of the portion of the general waveform of the clock signal and the different portions of the general waveform of the third signal.

6. The test and measurement instrument of claim 1, wherein:
the first set of trigger criteria includes an A-Event and a B-Event; and
each of the subsequent sets of trigger criteria includes a $B_X$-Event,
wherein X is configured to advance from 1 to the number of sets of subsequent trigger criteria, and the change in X represents a dynamic change in the sequence relationship between the A- and B-Event components of the sets of trigger criteria.

7. The test and measurement instrument 6, wherein:
a first triggered acquisition captured using the acquisition circuitry is associated with the first set of trigger criteria;
each of the remaining triggered acquisitions captured by the acquisition circuitry is associated with one of the subsequent sets of trigger criteria; and
the controller is configured to scan information associated with the first triggered acquisition and, depending on the nature of the scanned information, automatically adjust the B-Event component of the subsequent sets of trigger criteria.

8. The test and measurement instrument of claim 1, wherein:
the waveform associated with the first set of trigger criteria comprises a first portion of a general waveform;
each of the plurality of additional waveforms associated with the subsequent sets of trigger criteria comprises an additional different portion of the general waveform;
the general waveform corresponds to the signal received at the input terminal; and
the controller is configured to cause the simultaneously display of the first portion and the additional different portions of the general waveform.

9. The test and measurement instrument of claim 1, further comprising a repetition factor configurable by a user to adjust a number of individual single waveforms associated with each set of trigger criteria, wherein the number of individual single waveforms selected controls a rate at which the waveforms are displayed.

10. A method for dynamically triggering a test and measurement instrument, the method comprising:
receiving a signal at an input terminal of the test and measurement instrument;
acquiring a plurality of triggered acquisitions;
triggering the test and measurement instrument responsive to trigger criteria, wherein the trigger criteria comprises a first set of trigger criteria;
reconfiguring the trigger criteria from the first set of trigger criteria to subsequent sets of trigger criteria between each of the triggered acquisitions;
triggering on each of the subsequent sets of trigger criteria;
dynamically reconfiguring the trigger criteria between at least two of the triggered acquisitions in dependence upon the acquired data; and
simultaneously displaying:
a waveform associated with the first set of trigger criteria; and
a plurality of additional waveforms, each additional waveform associated with one of the subsequent sets of trigger criteria so that the waveforms associated with each trigger criteria are overlapped in a single accumulated view of different portions of the signal.

11. The method of claim 10, further comprising:
associating a first triggered acquisition with the first set of trigger criteria;

scanning information associated with the first triggered acquisition and, depending on the nature of the scanned information, automatically adjusting a B-Event component of the subsequent set of trigger criteria.

12. The method of claim 10, further comprising:

dynamically changing a sequence relationship between A- and B-Events between at least two of the plurality of triggered acquisitions.

13. The method of claim 10, further comprising:

adjusting a repetition factor to control the number of individual single waveforms associated with each set of trigger criteria; and based on the repetition factor, controlling a rate at which the waveforms are displayed.

14. The method of claim 10, further comprising:

examining data associated with one of the triggered acquisitions; and determining whether to keep or abandon the triggered acquisition based on the examination of the acquired data; and determining whether to reconfigure the trigger criteria based on the examination of the acquired data.

15. An article comprising a machine-accessible non-transitory medium having associated instructions that, when executed, results in a machine performing the steps of claim 10.

* * * * *